(12) United States Patent
Im

(10) Patent No.: US 7,772,916 B2
(45) Date of Patent: Aug. 10, 2010

(54) INTERNAL VOLTAGE GENERATOR OF SEMICONDUCTOR DEVICE AND METHOD FOR GENERATING INTERNAL VOLTAGE

(75) Inventor: Jae-Hyuk Im, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 160 days.

(21) Appl. No.: 11/967,832

(22) Filed: Dec. 31, 2007

(65) Prior Publication Data

US 2008/0284486 A1 Nov. 20, 2008

(30) Foreign Application Priority Data

May 14, 2007 (KR) .................. 10-2007-0046353

(51) Int. Cl.
*H03K 3/01* (2006.01)

(52) U.S. Cl. ..................... 327/534; 327/538

(58) Field of Classification Search ......... 327/534–539, 327/589, 390
See application file for complete search history.

(56) References Cited

U.S. PATENT DOCUMENTS

| 5,446,697 | A | 8/1995 | Yoo et al. |
| 5,877,651 | A * | 3/1999 | Furutani ............... 327/538 |
| 5,892,386 | A | 4/1999 | Lee et al. |
| 5,952,872 | A * | 9/1999 | Hur ..................... 327/535 |
| 5,999,099 | A * | 12/1999 | Stobbe ................ 340/572.8 |
| 6,194,954 | B1 * | 2/2001 | Kim et al. ............. 327/535 |
| 6,867,641 | B2 | 3/2005 | Kang et al. |
| 6,947,347 | B2 | 9/2005 | Fujioka |
| 6,958,947 | B2 | 10/2005 | Park et al. |
| 7,315,193 | B2 * | 1/2008 | Anand et al. .......... 327/525 |
| 2004/0001385 | A1 | 1/2004 | Kang |
| 2006/0002222 | A1 | 1/2006 | Lee |

FOREIGN PATENT DOCUMENTS

| JP | 08-147998 | 6/1996 |
| JP | 10-125097 | 5/1998 |
| JP | 2003-085977 | 3/2003 |
| KR | 10-2004-0046660 A | 6/2004 |

* cited by examiner

*Primary Examiner*—Dinh T. Le
(74) *Attorney, Agent, or Firm*—Blakely, Sokoloff, Taylor & Zafman

(57) ABSTRACT

An internal voltage generator of a semiconductor device consumes relatively small amount of driving current and generates a stable internal voltage with relatively small voltage level variation. The semiconductor device includes an oscillator configured to generate an oscillation signal in response to an input signal, wherein the oscillation signal oscillates with a first period and oscillates with a second period longer than the first period during a predetermined latter section, and an internal circuit configured to perform a predetermined operation in response to the oscillation signal.

25 Claims, 10 Drawing Sheets

INTERNAL VOLTAGE GENERATOR OF SEMICONDUCTOR DEVICE AND METHOD FOR GENERATING INTERNAL VOLTAGE

CROSS-REFERENCE TO RELATED APPLICATIONS

The present invention claims priority to Korean patent application number 2007-0046353, filed on May 14, 2007, which is incorporated by reference in its entirety.

BACKGROUND OF THE INVENTION

The present invention relates to semiconductor design technology, particularly, to an internal voltage generator of a semiconductor device, and more particularly, to a circuit capable of generating an internal voltage with stable voltage level variation.

Most semiconductor devices including DRAMs employ an internal voltage generator in a chip so as to generate internal voltages with various levels using a power supply voltage (VDD) and a ground voltage (VSS) applied from outside the device, thereby supplying a voltage required for operating internal circuits in the chip itself. A main issue in designing such an internal voltage generator is to stably supply an internal voltage with a desired level.

Recently, studies are being conducted on semiconductor devices with low power consumption as well as high-speed performance. Accordingly, a new design technology is required to meet the performance required under a low voltage condition. Under such a low voltage condition, most semiconductor devices need a boosted voltage (VPP) having a higher voltage level than a power supply voltage (VDD) so as to compensate for a voltage loss occurring when it operates using the power supply voltage (VDD), and to retain data normally.

In particular, DRAMs widely use the boosted voltage (VPP) for compensating loss caused by a threshold voltage of an MOS transistor in a word line driving circuit, a signal line separating circuit, a data output buffer circuit, and so forth.

In DRAMs, a back bias voltage (VBB) having a lower voltage than a ground voltage (VSS) is applied to a bulk of an NMOS transistor used as a cell transistor.

Since the boosted voltage (VPP) and the back bias voltage (VBB) are generated in a charge-pumping manner and they are thus generated through the same generation mechanism, circuits for generating them can be similarly configured.

FIG. 1 is a block diagram illustrating a conventional internal voltage generator of a semiconductor device.

Referring to FIG. 1, the conventional internal voltage generator of the semiconductor device includes a voltage level detector 100, an oscillator 120 and a pump 160. The voltage level detector 100 detects a voltage level of an internal voltage (VPP) terminal to output a detection signal PPE. The oscillator 120 generates an oscillation signal OSC of a predetermined frequency in response to the detection signal PPE. The pump 160 performs a charge pumping operation to output an internal voltage VPP to the internal voltage (VPP) terminal in response to the oscillation signal OSC.

FIG. 2A is a circuit diagram illustrating the voltage level detector 100 of FIG. 1.

Referring to FIG. 2A, the voltage level detector 100 of the conventional internal voltage generator includes a voltage divider 102 for dividing the internal voltage VPP by a predetermined ratio to thereby generate a division voltage DIV_VPP, and a voltage comparator 104 for comparing the division voltage DIV_VPP with a reference voltage VREF and outputting the detection signal PPE of which a logic level is determined according to the comparison result.

The voltage divider 102 includes a first fixed resistor R1 and a second fixed resistor R2 which have predetermined resistances and are connected in series between the internal voltage (VPP) terminal and a ground voltage (VSS) terminal. The voltage divider 102 generates the division voltage DIV_VPP through a connection node between the first and second fixed resistors R1 and R2.

The voltage comparator 104 includes a unit amplifier 1042 for changing a level of a voltage applied to an output terminal OUTN corresponding to a level difference between the division voltage DIV_VPP and the reference voltage VREF, and a driver 1044 for outputting the detection signal PPE corresponding to a level of a voltage applied to the output terminal OUTN.

The unit amplifier 1042 of the voltage comparator 104 includes first and second PMOS transistors P1 and P2 connected to each other in a current mirror form, a first NMOS transistor N1 for receiving the division voltage DIV_VPP through a gate thereof, a second NMOS transistor N2 for receiving the reference voltage VREF through a gate thereof, and a third NMOS transistor N3 used as a current source of the unit amplifier 1042 in response to a bias voltage.

The driver 1044 of the voltage comparator 104 includes at least one inverter INV for determining a logic level of the detection signal PPE outputted on the basis of a predetermined logic threshold voltage level corresponding to the level of the voltage applied to the output terminal OUTN of the unit amplifier 1042.

Herein, a detectable level of a logic level variation is defined as the logic threshold voltage level. That is, the logic level of the detection signal PPE is determined by comparing a level of the voltage applied to the output terminal OUTN of the unit amplifier 1042 with the logic threshold voltage level.

FIG. 2B is a circuit diagram illustrating the oscillator 120 of FIG. 1.

Referring to FIG. 2B, the oscillator 120 of the conventional internal voltage generator includes a NAND gate NAND, a first inverter chain 122 and a second inverter chain 124. The NAND gate NAND performs a NAND operation on the detection signal PPE and a feedback signal FBS. The first inverter chain 122 inverts an output signal of the NAND gate NAND to output the oscillation signal OSC. The second inverter chain 124 inverts the oscillation signal OSC to output the feedback signal FBS.

Herein, the first inverter chain 122 includes odd number of inverters, for example, three inverters INT1, INT2 and INT3. Herein, the number of the inverters provided in the first inverter chain 122 is at least one or more.

Likewise, the second inverter chain 124 includes odd number of inverters, for example, three inverters INT4, INT5 and INT6. Herein, the number of the inverters provided in the second inverter chain 124 is at least one or more.

An operation of the conventional internal voltage generator having the above construction will be described below.

The voltage level detector 100 compares a voltage level of the internal voltage VPP feedback from the internal voltage (VPP) terminal of the pump 160 with a voltage level of the reference voltage VREF, thereby outputting the detection signal PPE.

For example, when the internal voltage VPP has a lower voltage level than the reference voltage VREF, the magnitude of current flowing through a drain-source path of the first NMOS transistor N1 is smaller than the magnitude of current flowing through a drain-source path of the second NMOS transistor N2. Here, a resistance of the first NMOS transistor N1 changes in response to the division voltage DIV_VPP obtained by dividing the internal voltage VPP by the predetermined ratio, and a resistance of the second NMOS transistor N2 changes in response to the reference voltage VREF.

Therefore, a level of a voltage applied to an input node ZN is higher than a level of a voltage applied to an output node OUTN. When the level of the voltage applied to the output node OUTN becomes lower than the logic threshold voltage level of the driver 1044, the activated detection signal PPE of logic high level is generated.

When the internal voltage has a higher voltage level than the reference voltage VREF, the magnitude of current flowing through the drain-source path of the first NMOS transistor N1 is greater than the magnitude of current flowing through the drain-source path of the second NMOS transistor N2. Likewise, the resistance of the first NMOS transistor N1 changes in response to the division voltage DIV_VPP obtained, and the resistance of the second NMOS transistor N2 changes in response to the reference voltage VREF.

Accordingly, the level of the voltage applied to the input node ZN is lower than the level of the voltage applied to the output node OUTN. That is, the level of the voltage applied to the output node OUTN increases to be higher than the logic threshold voltage level of the driver 1044, and thus the deactivated detection signal PPE of logic low level is generated.

An activation section of the detection signal PPE may differ corresponding to a level difference between the internal voltage VPP and the reference voltage VREF.

That is, when the level difference between the internal voltage VPP and the reference voltage VREF is relatively great, the detection signal PPE with a relatively long activation section is generated. On the contrary, when the level difference between the internal voltage VPP and the reference voltage VREF is relatively small, the detection signal PPE with a relatively short activation section is generated.

A method of comparing the division voltage DIV_VPP, which is obtained by diving the internal voltage VPP by a predetermined ratio, with the reference voltage VREF is employed herein, but this method is just one of several methods of comparing the internal voltage VPP with the reference voltage VREF.

The reference voltage VREF is generated by a bandgap circuit, and maintains a target level of the internal voltage VPP irrespective of variations of process, voltage and temperature (PVT).

The oscillator 120 generates the oscillation signal OSC oscillating at a predetermined frequency in response to a logic level of the detection signal PPE inputted from the voltage level detector 100.

For instance, when the activated detection signal PPE of logic high level is inputted, the oscillation signal OSC oscillates at the predetermined frequency. On the contrary, when the deactivated detection signal PPE of logic low level is inputted, the oscillation signal OSC does not oscillate but maintains the deactivation state of logic low level.

In other words, when the internal voltage VPP has a lower voltage level than the reference voltage VREF, the oscillation signal OSC oscillates at a predetermined frequency; and when the internal voltage VPP has a higher voltage level than the reference voltage VREF, the oscillation signal OSC does not oscillate but maintains the deactivation state of logic low level.

When the inputted oscillation signal OSC oscillates at the predetermined frequency, the pump 160 performs a charge pumping operation to generate the internal voltage VPP. When, however, the oscillation signal OSC does not oscillate but is under a deactivation state, the pump 160 does not perform a charge pumping operation thereby not to generate the internal voltage VPP.

That is, the pump 160 performs a charge pumping operation to generate the internal voltage VPP when the level of the internal voltage VPP is lower than that of the reference voltage VREF. Contrariwise, the pump 160 does not perform the charge pumping operation and does not generate the internal voltage VPP when the level of the internal voltage VPP is higher than that of the reference voltage VREF.

From the aforesaid operation of the conventional internal voltage generator of the semiconductor device, it can be appreciated that the charge pumping operation is performed to increase the level of the internal voltage VPP when the level of the internal voltage VPP is lower than the level of the reference voltage VREF; but the pump 160 does not work to wait for the level of the internal voltage VPP to be lower than the level of the reference voltage VREF. The level of the internal voltage VPP may become lower than the level of the reference voltage VREF if the internal voltage VPP is used for a predetermined operation of the semiconductor device or charges are naturally discharged.

In the conventional internal voltage generator, the method of detecting the voltage level of the internal voltage (VPP) terminal using the voltage level detector 100 was adopted for detecting the level of the internal voltage VPP.

However, in order that the voltage level detector 100 may detect the level of the internal voltage VPP to output the detection signal PPE, several operations should be performed, including: dividing the internal voltage VPP by the predetermined ratio to output the division voltage DIV_VPP; comparing the voltage level of the division voltage DIV_VPP with that of the reference voltage VREF; and determining a logic level of the detection signal PPE corresponding to the comparison result. Therefore, it takes a lot of time to perform the above-described processes.

Like this, if the time taken for the voltage level detector 100 to determine the logic level of the detection signal VPP corresponding to the variation of the voltage level of the internal voltage (VPP) terminal is elongated, it gives rise to problems as follows.

FIG. 3 is a timing diagram illustrating a voltage level variation of the internal voltage generated by the conventional internal voltage generator of FIG. 1.

From FIG. 3, it can be appreciated that a level variation of the internal voltage generated by the conventional internal voltage generator of FIG. 1 is relatively high.

Specifically, when the voltage level detector 100 detects, at an initial state, that the level of the internal voltage VPP is lower than a target level of the internal voltage VPP, the detection signal PPE is activated to logic high level to increase the level of the internal voltage VPP through the charge pumping operation of the pump 160 (①).

When the level of the internal voltage VPP which is rising up is greater than the target level, the voltage level detector 100 detects it so that the charge pumping operation of the pump 160 must be stopped by deactivating the detection signal PPE to logic low level.

In the conventional internal voltage generator of the semiconductor device, however, the time taken for the voltage level detector 100 to determine the logic level of the detection signal VPP is relatively long, the voltage level detector 100 cannot promptly deactivate the detection signal PPE to logic low level at the instant that the level of the internal voltage VPP is greater than the target level of the internal voltage VPP. Resultingly, the charge pumping operation of the pump 160 is not promptly stopped so that the voltage level of the internal voltage VPP still increases to a relatively higher level than the target level (②).

Therefore, the voltage level of the internal voltage VPP increases excessively, which affects an operating speed of a semiconductor device, leading to an unstable operation of the semiconductor device.

Moreover, there is a great likelihood that the semiconductor device using such an internal voltage VPP may operate unpredictably. That is, the semiconductor device cannot operate reliably.

In order to increase a processing speed of the voltage level detector 100 in the internal voltage generator of the semiconductor device, the amount of driving current for driving the voltage level detector 100 may be increased. This, however, causes the voltage level detector 100 to unnecessarily consume a lot of driving current even during a stand-by mode when the voltage level detector 100 does not operate, and thus it is not suitable for a state-of-the-art semiconductor device that has to use smaller and smaller amount of driving current.

SUMMARY OF THE INVENTION

Embodiments of the present invention are directed to providing an internal voltage generator of a semiconductor device, which consumes relatively small amounts of driving current and generates a stable internal voltage with relatively small voltage level variation.

In accordance with an aspect of the present invention, there is provided a semiconductor device including an oscillator configured to generate an oscillation signal in response to an input signal, wherein the oscillation signal oscillates with a first period and oscillates with a second period longer than the first period during a predetermined latter section, and an internal circuit configured to perform a predetermined operation in response to the oscillation signal.

In accordance with another aspect of the present invention, there is provided an internal voltage generator of a semiconductor device, including a voltage level detector configured to detect a voltage level of an internal voltage terminal to output a detection signal, an oscillation signal generator configured to generate an oscillation signal in response to the detection signal, wherein the oscillation signal oscillates with a first period and oscillates with a second period longer than the first period during a predetermined latter section, and a pump configured to perform a charge pumping operation to output an internal voltage through the internal voltage terminal in response to the oscillation signal.

In accordance with further aspect of the present invention, there is provided a method for generating an internal voltage of a semiconductor device, including detecting a voltage level of an internal voltage terminal to output a detection signal, generating an oscillation signal in response to the detection signal, wherein the oscillation signal oscillates with a first period and oscillates with a second period longer than the first period during a predetermined latter section, and performing a charge pumping operation to output an internal voltage through the internal voltage terminal in response to the oscillation signal.

DESCRIPTION OF SPECIFIC EMBODIMENTS

Hereinafter, an internal voltage generator of a semiconductor device and a method for generating an internal voltage in accordance with the present invention will be described in detail with reference to the accompanying drawings.

Figure 4:
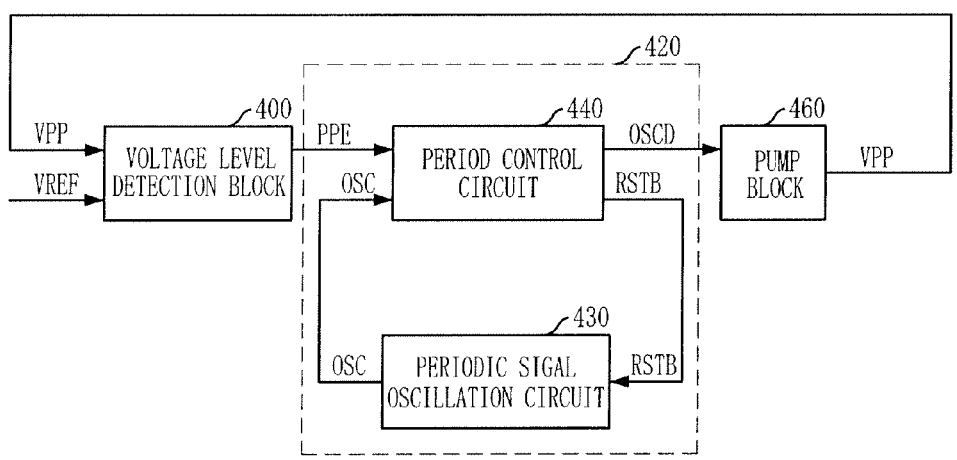
FIG. 4 is a block diagram illustrating an internal voltage generator of a semiconductor device in accordance with an embodiment of the present invention.

FIG. 4 is a block diagram illustrating an internal voltage generator of a semiconductor device in accordance with an embodiment of the present invention.

Referring to FIG. 4, the internal voltage generator of the semiconductor device in accordance with the embodiment of the present invention includes a voltage level detection block 400, an oscillation signal generation block 420 and a pump block 460. The voltage level detection block 400 detects a voltage level of an internal voltage (VPP) terminal to output a detection signal PPE. The oscillation signal generation block 420 is responsive to the detection signal PPE to generate an oscillation signal OSCD which oscillates with a predetermined first period and then oscillates with a second period longer than the first period during a latter section. The pump block 460 performs a charge pumping operation in response to the oscillation signal OSCD to thereby output an internal voltage VPP through the internal voltage (VPP) terminal.

The oscillation signal generation block 420 includes a periodic signal oscillation circuit 430 and a period control circuit 440. The periodic signal oscillation circuit 430 generates a periodic signal OSC that oscillates with the first period in response to an oscillation control signal RSTB. The period control circuit 440 controls a logic level of the oscillation control signal RSTB in response to the detection signal PPE, and receives a resultant periodic signal OSC to output the oscillation signal OSCD, wherein the period control circuit 440 controls the period of the oscillation signal OSCD to change from the first period to the second period according to the detection signal PPE and an option.

Hereinafter, an operation of the internal voltage generator having the above-described construction in accordance with the embodiment of the present invention will be described in detail.

First, the voltage level detection block 400 compares a voltage level of the internal voltage VPP with that of a reference voltage VREF, and determines a logic level of the detection signal PPE corresponding to a comparison result.

That is, when the internal voltage VPP has a lower voltage level than the reference voltage VREF, the voltage level detection block 400 outputs the activated detection signal PPE. On the contrary, when the when the internal voltage VPP has a higher voltage level than the reference voltage VREF, the voltage level detection block 400 outputs the deactivated detection signal PPE.

Such an operation of the voltage level detection block 400 has been fully described already in Background Of The Invention, and thus further description for it will be omitted herein.

The oscillation signal generation block 420 generates the oscillation signal OSCD of which oscillation operation is controlled in response to the detection signal PPE outputted from the voltage level detection block 400, wherein the oscillation signal OSCD oscillates with the first period during an initial section and thereafter oscillates with the second period longer than the first period during the latter section.

An entry point of the initial section is defined herein as a point of time that the oscillation signal OSCD starts to oscillate as the activated detection signal PPE generated from the voltage level detection block 400 is inputted. In other words, the entry point of the initial section means a point of time that the deactivated oscillation signal OSCD starts to oscillate.

Therefore, what the oscillation signal OSCD oscillates with the predetermined first period during the initial section means that the oscillation signal OSCD oscillates with the predetermined first period at the time point that the deactivated oscillation signal OSCD starts to oscillate.

An entry point of the latter section, which can be arbitrarily selected by a designer, is defined herein as a point of time that the oscillation signal OSCD oscillating with the first period changes to oscillate with the second period longer than the first period. That is, the entry point of the latter section means a point of time that the oscillation period of the oscillation signal OSCD changes from the first period to the second period.

Therefore, the entry point of the latter section is identical to an exit point of the initial section. An exit point of the latter section is defined as a point of time that an oscillation of the oscillation signal OSCD is terminated as the deactivated detection signal PPE is inputted.

The periodic signal oscillation circuit 430 of the oscillation signal generation block 420 generates the periodic signal OSC that oscillates with the first period when the inputted oscillation control signal RSTB is activated to logic high level. Contrariwise, the periodic signal oscillation circuit 430 generates the periodic signal OSC that maintains its deactivation state of logic low level when the inputted oscillation control signal RSTB is deactivated to logic low level.

The period control circuit 440 of the oscillation signal generation block 420 performs two operations at the same time, which will be described below.

First, when the activated detection signal PPE of logic high level is inputted, the activated oscillation control signal RSTB of logic high level is outputted. On the contrary, when the detection signal PPE of logic low level is inputted, the deactivated oscillation control signal RSTB of logic low level is outputted.

As the activated detection signal PPE of logic high level is inputted, the oscillation control signal RSTB is activated to logic high level. Then, the periodic signal oscillation circuit 430 generates the periodic signal OSC oscillating with the predetermined first period.

Thus, the oscillation signal OSCD, which oscillates with the predetermined first period during the initial section and thereafter oscillates with the second period longer than the first period during the latter section, is outputted in response to the periodic signal OSC oscillating with the predetermined first period and the activated detection signal PPE of logic high level.

A first operation of the period control circuit 440 is to determine a logic level of the oscillation control signal RSTB in response to the detection signal PPE. A second operation of the period control circuit 440 is to control the oscillation period of the oscillation signal OSCD to change from the predetermined first period to the predetermined second period at a predetermined point of time in response to the detection signal PPE and the periodic signal OSC.

The pump block 460 performs a charge pumping operation to generate the internal voltage VPP in response to the oscillation of the oscillation signal OSCD.

When the oscillation signal OSCD oscillates with the predetermined first period during the initial operation, the pump block 460 performs a relatively rapid charge pumping operation to sharply increase a voltage level of the internal voltage VPP.

When the oscillation signal OSCD oscillates with the predetermined second period longer than the first period during the latter operation, the pump block 460 performs a relatively slow charge pumping operation to slowly increase a voltage level of the internal voltage VPP.

When the inputted oscillation signal OSCD does not oscillate but maintains its deactivation state of logic low level, the pump block 460 does not perform the charge pumping operation, thereby not generating the internal voltage VPP.

Figure 5:
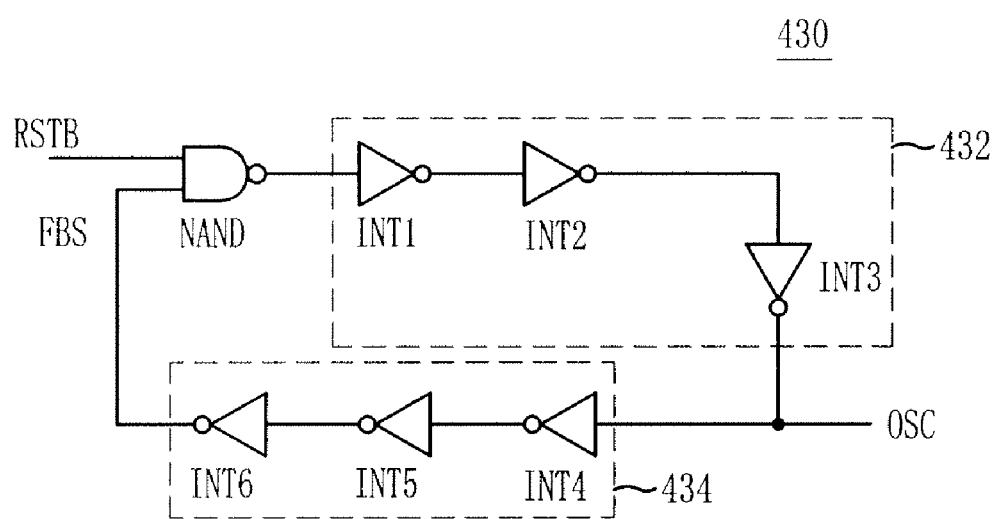
FIG. 5 is a circuit diagram illustrating a periodic signal oscillation circuit of FIG. 4.

FIG. 5 is a circuit diagram illustrating the periodic signal oscillation circuit 430 of FIG. 4.

Referring to FIG. 5, the periodic signal oscillation circuit 430 in the internal voltage generator of FIG. 4 includes a NAND gate NAND, a first inverter chain 432 and a second inverter chain 434. The NAND gate NAND performs a NAND operation on the oscillation control signal RSTB and a feedback signal FBS. The first inverter chain 432 inverts an output signal of the NAND gate NAND to output the periodic signal OSC. The second inverter chain 434 inverts the periodic signal OSC to output the feedback signal FBS.

Herein, the first inverter chain 432 includes odd number of inverters, for examples, three inverters INT1, INT2 and INT3. Herein, the number of the inverters provided in the first inverter chain 432 is at least one or more.

Likewise, the second inverter chain 434 includes odd number of inverters, for example, three inverters INT4, INT5 and INT6. Herein, the number of the inverters provided in the second inverter chain 434 is at least one or more.

Figure 1:
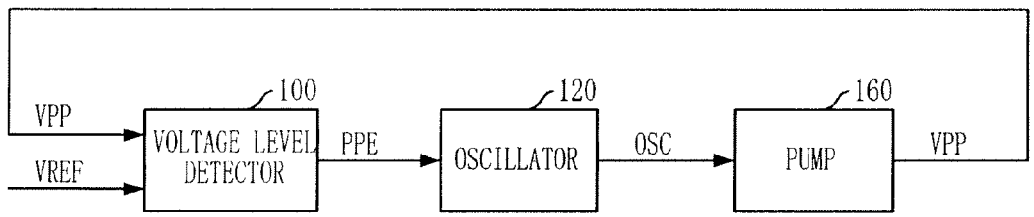
FIG. 1 is a block diagram illustrating a conventional internal voltage generator of a semiconductor device.
Figure 2A:
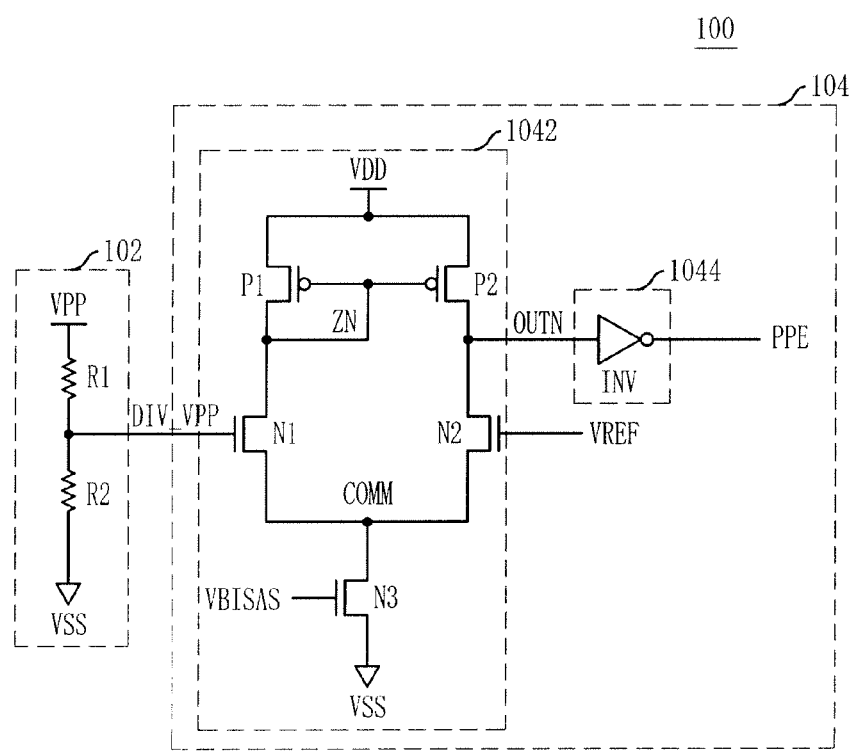
FIG. 2A is a circuit diagram illustrating a voltage level detector of FIG. 1.
Figure 2B:
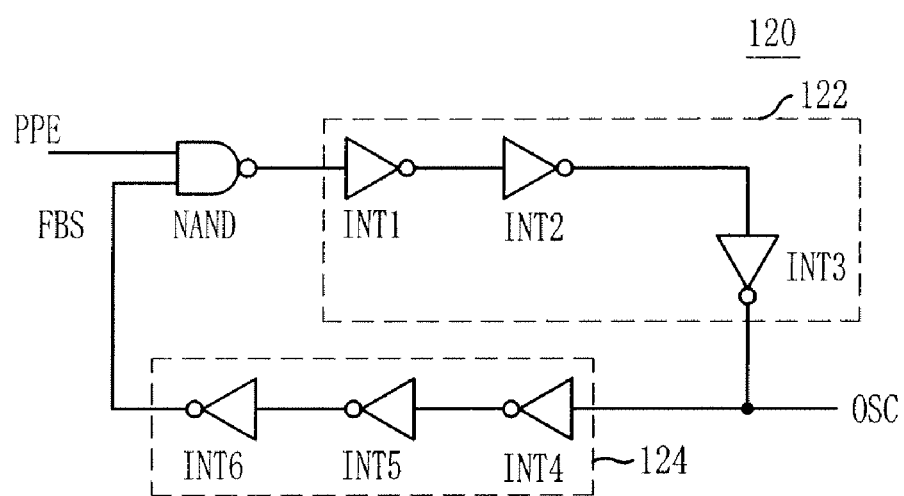
FIG. 2B is a circuit diagram illustrating an oscillator of FIG. 1.
Figure 3:
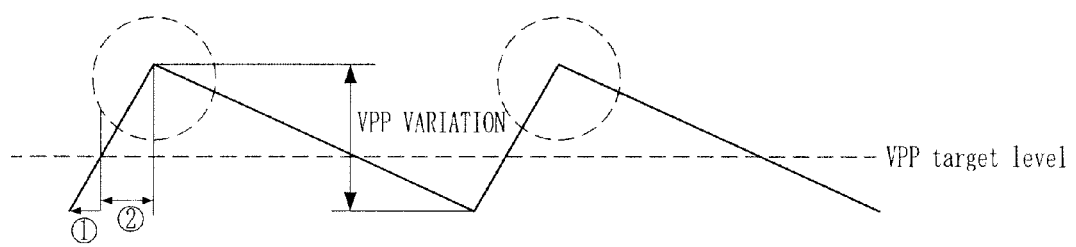
FIG. 3 is a timing diagram illustrating a voltage level variation of an internal voltage generated by the conventional internal voltage generator of FIG. 1.

The periodic signal oscillation circuit 430 has the same construction as the oscillator (120 of FIG. 2) of the conventional internal voltage generator. However, while the oscillator (120 of FIG. 2) of the conventional internal voltage generator operates in response to the detection signal PPE, the operation of the periodic signal oscillation circuit 430 in accordance with the embodiment of the present invention is controlled in response to the oscillation control signal RSTB outputted from the period control circuit 440.

Figure 6:
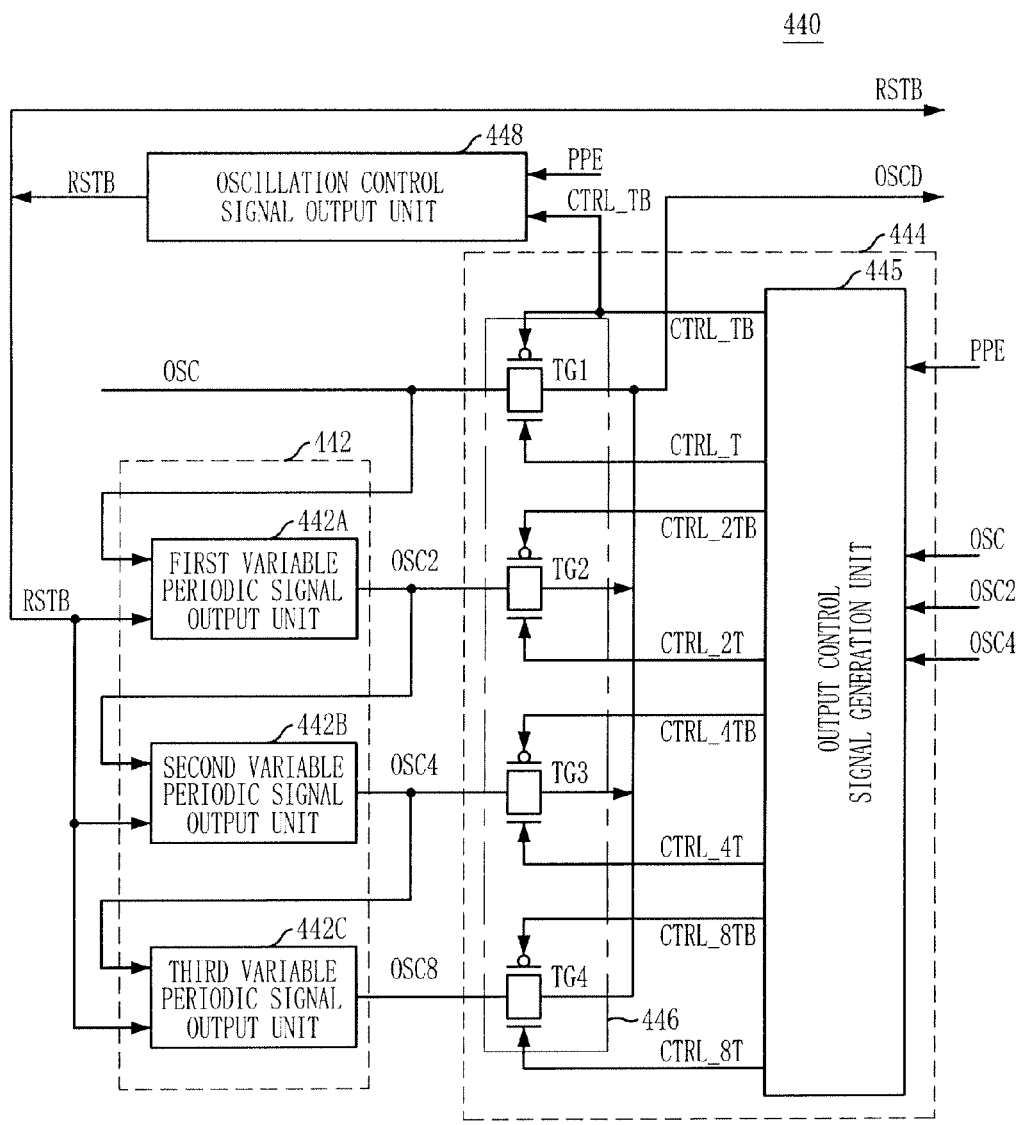
FIG. 6 is a block diagram illustrating a period control circuit of FIG. 4.

FIG. 6 is a block diagram illustrating the period control circuit 440 of FIG. 4.

Referring to FIG. 6, the period control circuit 440 includes a variable periodic signal generation unit 442, a signal selection unit 444 and an oscillation control signal output unit 448. The variable periodic signal generation unit 442 generates a plurality of variable periodic signals OSC2, OSC4 and OSC8 having the second period longer than the first period in response to the oscillation control signal RSTB and the periodic signal OSC. Herein, the plurality of variable periodic signals OSC2, OSC4 and OSC8 have different periods from each other. The signal selection unit 444 outputs the periodic signal OSC as the oscillation signal OSCD during the initial section, and selects one of the plurality of variable periodic signals OSC2, OSC4 and OSC8 to output the selected one as the oscillation signal OSCD according to the detection signal PPE and an option during the latter section. Further, the signal selection unit 444 determines the entry point of the latter section in response to the periodic signal OSC and the plurality of variable periodic signals OSC2, OSC4 and OSC8. The oscillation control signal output unit 448 outputs the oscillation control signal RSTB of which a level is changed in response to the detection signal PPE and an output control signal CTRL_TB deactivated at the entry point of the latter section. Details for the output control signal CTRL_TB will be fully described later.

The variable periodic signal generation unit 442 includes a first variable periodic signal output unit 442A, a second variable periodic signal output unit 442B, and a third variable periodic signal output unit 442C. The first variable periodic signal output unit 442A receives the periodic signal OSC and the oscillation control signal RSTB to output a first variable periodic signal OSC2 having the second period twice the first period. The second variable periodic signal output unit 442B receives the first variable periodic signal OSC2 and the oscillation control signal RSTB to output the second variable periodic signal OSC4 having a second period four times the first period. The third variable periodic signal output unit 442C receives the second variable periodic signal OSC4 and the oscillation control signal RSTB to output a third variable periodic signal OSC8 having the second period eight times the first period.

The signal selection unit 444 includes a multiplexing unit 446 and an output control signal generation unit 445. The multiplexing unit 446 selects one signal from the periodic signal OSC and the variable periodic signals OSC2, OSC4 and OSC8 in response to output control signals CTRL_TB, CTRL_T, CTRL_2TB, CTRL_2T, CTRL_4TB, CTRL_4T, CTRL_8TB and CTRL_8T, thereby outputting the selected signal as the oscillation signal OSCD. The output control signal generation unit 445 generates the output control signals CTRL_TB, CTRL_T, CTRL_2TB, CTRL_2T, CTRL_4TB, CTRL_4T, CTRL_8TB and CTRL_8T in response to the detection signal PPE, the option, the periodic signal OSC and the plurality of variable periodic signals OSC2 and OSC4.

The multiplexing unit 446 of the signal selection unit 444 includes a plurality of pass gates TG1, TG2, TG3 and TG4 configured to control the inputted periodic signal OSC and the plurality of variable periodic signals OSC2, OSC4 and OSC8 to be outputted in response to the output control signals CTRL_TB, CTRL_T, CTRL_2TB, CTRL_2T, CTRL_4TB, CTRL_4T, CTRL_8TB and CTRL_8T.

An operation of the period control circuit 440 of the internal voltage generator will be described in detail below.

When the oscillation control signal RSTB is activated to logic high level, the variable periodic signal generation unit 442 generates the plurality of variable periodic signals OSC2, OSC4 and OSC8 having the second period longer than the predetermined first period in response to the periodic signal OSC oscillating with the predetermined first period.

The variable periodic signal generation unit 442 includes the plurality of variable periodic signal output units 442A, 442B and 442C so as to generate the plurality of variable periodic signals OSC2, OSC4 and OSC8.

That is, the variable periodic signal generation unit 442 includes the first variable periodic signal output unit 442A configured to output the first variable periodic signal OSC2 having the second period twice the period of the periodic signal OSC oscillating with the predetermined first period, the second variable periodic signal output unit 442B configured to output the second variable periodic signal OSC4 having the second period four times the period of the periodic signal OSC oscillating with the predetermined first period, and the third variable periodic signal output unit 442C configured to output the third variable periodic signal OSC8 having the second period eight times the period of the periodic signal OSC oscillating with the predetermined first period.

Herein, it is illustrated that the variable periodic signal generation unit 442 includes the first through third variable periodic signal output units 442A, 442B and 442C, the present invention is not limited thereto. Thus, the number of the variable periodic signal output units included in the variable periodic signal generation unit 442 may be modified by a designer. That is, the variable periodic signal generation unit 442 may include the variable periodic signal output units more than or less than the first through third variable periodic signal output units 442A, 442B and 442C described herein.

The period of each variable periodic signal OSC2, OSC4 and OSC8 generated by each variable periodic signal output unit 442A, 442B and 442C can also be modified by a designer. That is, the first variable periodic signal OSC2 does not oscillate with the second period twice the period of the periodic signal OSC oscillating with the predetermined first period but may oscillate with a period longer than or shorter than the second period according to a designer's selection.

The oscillation control signal output unit 448 outputs the oscillation control signal RSTB, which is activated to a logic high level when the detection signal PPE is activated to logic high level and maintains its deactivation state of logic low level for a predetermined time in response to the output control signal CTRL_TB deactivated at the entry point of the latter section.

The output control signal CTRL_TB, as described above, deactivated at the entry point of the latter section is a signal that is activated at a point of time that the oscillation signal OSCD oscillating with the predetermined first period starts to oscillate with the second period longer than the first period. The output control signal CTRL_TB is inputted from the signal selection unit 444.

Why the oscillation control signal RSTB is deactivated to logic low level for a predetermined time at the entry point of the latter section is to initialize the variable periodic signal generation unit 442 at the entry point of the latter section.

The signal selection unit 444 selects one signal among the periodic signal OSC and the plurality of variable periodic signals OSC2, OSC4 and OSC8 generated from the variable periodic signal generation unit 442, when the detection signal PPE is activated to logic high level.

The oscillation signal OSCD oscillates with the predetermined first period equal to the period of the periodic signal OSC during the initial section, and thereafter oscillates with the second period longer than the first period during the latter section. Herein, the second period may be equal to a period of one signal selected from the plurality of variable periodic signals OSC2, OSC4 and OSC8.

Therefore, the signal selection unit 444 performs the operation of determining the entry point of the latter section in response to the option, the periodic signal OSC and the plurality of variable periodic signals OSC2 and OSC4, and also performs the operation of determining which variable periodic signal of the plurality of variable periodic signals OSC2, OSC4 and OSC8 is outputted as the oscillation signal OSCD during the latter section.

The multiplexing unit 446 of the signal selection unit 444 controls the periodic signal OSC to be outputted as the oscillation signal OSCD in response to a first output control signal CTRL_T and an inverted first output control signal CTRL_TB; controls the first variable periodic signal OSC2 to be outputted as the oscillation signal OSCD in response to a second output control signal CTRL_2T and an inverted second output control signal CTRL_2TB; controls the second variable periodic signal OSC4 to be outputted as the oscillation signal OSCD in response to a third output control signal CTRL_4T and an inverted third output control signal CTRL_4TB; and controls the third variable periodic signal OSC8 to be outputted as the oscillation signal OSCD in response to a fourth output control signal CTRL_8T and an inverted fourth output control signal CTRL_8TB.

The output control signal generation unit 445 of the signal selection unit 444 generates the output control signals CTRL_TB, CTRL_T, CTRL_2TB, CTRL_2T, CTRL_4TB, CTRL_4T, CTRL_8TB and CTRL_8T for controlling the operation of the multiplexing unit 446.

During the initial section starting from the point of time that the detection signal PPE is activated to logic high level, the first output control signal CTRL_T is activated to logic high level and the inverted first output control signal CTRL_TB is activated to logic low level. Thus, the multiplexing unit 446 controls the periodic signal OSC to be outputted as the oscillation signal OSCD.

The second output control signal CTRL_2T is activated to logic high level and the inverted second output control signal CTRL_2TB is activated to logic low level, if the detection signal PPE maintains its activation state of logic high level and the second output control signal CTRL_2T and the inverted second output control signal CTRL_2TB are activated in response to the option at the point of time that the latter section starts in response to the periodic signal OSC, the plurality of periodic signals OSC2 and OSC4 and the option. Thus, the multiplexing unit 446 controls the first variable periodic signal OSC2 to be outputted as the oscillation signal OSCD.

Likewise, if the third output control signal CTRL_4T and the inverted third output control signal CTRL_4TB are activated in response to the option at the point of time that the latter section starts, the third output control signal CTRL_4T is activated to logic high level and the inverted third output control signal CTRL_4TB is activated to logic low level. Thus, the multiplexing unit 446 controls the second variable periodic signal OSC4 to be outputted as the oscillation signal OSCD.

Similarly, if the fourth output control signal CTRL_8T and the inverted fourth output control signal CTRL_8TB are activated in response to the option at the point of time that the latter section starts, the fourth output control signal CTRL_8T is activated to logic high level and the inverted fourth output control signal CTRL_8TB is activated to logic low level. Thus, the multiplexing unit 446 controls the third variable periodic signal OSC8 to be outputted as the oscillation signal OSCD.

Because the first output control signal CTRL_T is activated to logic high level and the inverted first output control signal CTRL_TB is activated to logic low level during the initial section, the entry point of the latter section is the point of time that the first output control signal CTRL_T is deactivated to logic low level and the inverted first output control signal CTRL_TB is deactivated to logic high level.

Therefore, the oscillation control signal output unit 448 can determine the entry point of the latter section using the deactivation of the first output control signal CTRL_T or the inverted first output control signal CTRL_TB.

Figure 7:
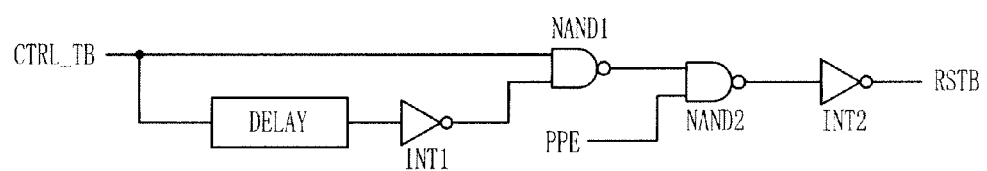
FIG. 7 is a circuit diagram illustrating an oscillation control signal output unit of FIG. 6.

FIG. 7 is a circuit diagram illustrating the oscillation control signal output unit 448 of FIG. 6.

Referring to FIG. 7, the oscillation control signal output unit 448 of the period control circuit 440 includes a delay, a first inverter INT1, a first NAND gate NAND1, a second NAND gate NAND2 and a second inverter INT2. The delay is configured to delay the output control signal CTRL_TB deactivated at the entry point of the latter section by a predetermined time. The first inverter INT1 inverts an output signal of the delay. The first NAND gate NAND1 performs a NAND operation on an output signal of the first inverter INT1 and the output control signal CTRL_TB deactivated at the entry point of the latter section. The second NAND gate NAND2 performs a NAND operation on an output signal of the first NAND gate NAND1 and the detection signal PPE. The second inverter INT2 receives an output signal of the second NAND gate NAND2 to output the oscillation control signal RSTB.

An operation of the oscillation control signal output unit 448 of the period control circuit 440 will be described in detail below.

When the deactivated detection signal PPE of logic low level is inputted, the output signal of the second NAND gate NAND2 goes to logic high level regardless of a logic level of the output signal of the first NAND gate NAND1. Therefore, the oscillation control signal RSTB is deactivated to logic low level.

When the activated detection signal PPE of logic high level is inputted, however, a logic level of the output signal of the second NAND gate NAND2 is determined in response to a logic level of the output signal of the first NAND gate NAND1.

Accordingly, considering the logic level of the output signal of the first NAND gate NAND1, the output control signal CTRL_TB deactivated at the entry point of the latter section is activated to logic low level and then inputted during the initial section starting from the point of time that the detection signal PPE is activated to logic high level.

That is, during the initial section, the output signal of the first NAND gate NAND1 is at logic high level and the output signal of the second NAND gate NAND2 is at logic low level. Therefore, the oscillation control signal RSTB goes to logic high level so that it is activated.

Afterwards, at the moment when the operation enters the latter section, the output control signal CTRL_TB deactivated at the entry point of the latter section is activated to logic high level, and the output signal of the first NAND gate NAND1 goes to logic low level and then goes to logic high level after the lapse of a predetermined time defined by the delay. Consequently, the output signal of the second NAND gate NAND2 is at logic high level for a predetermined time defined by the delay and then goes to logic low level again. Similarly, the oscillation control signal RSTB is at deactivation state of logic low level for a predetermined time defined by the delay and is then activated to logic high level again.

Figure 8:
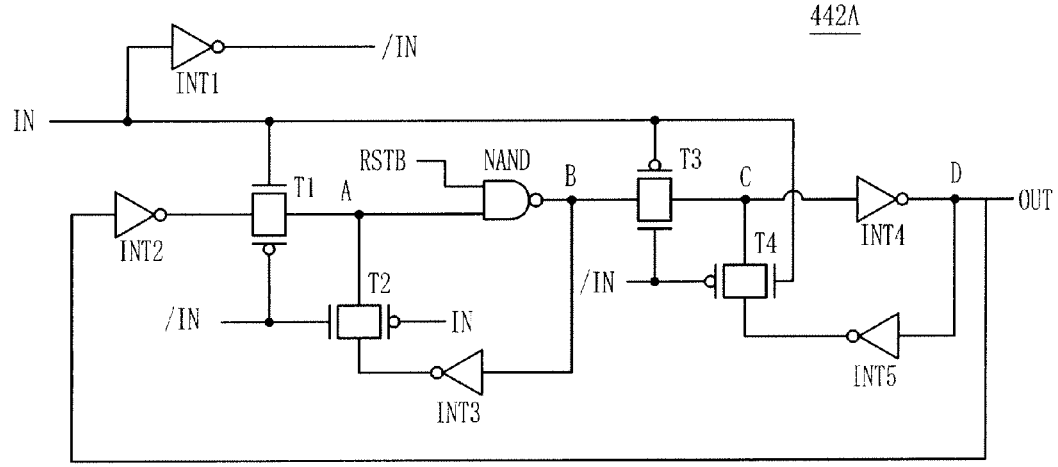
FIG. 8 is a circuit diagram illustrating a variable periodic signal generation unit of FIG. 6.

FIG. 8 is a circuit diagram illustrating the variable periodic signal generation unit 442 of FIG. 6.

Referring to FIG. 8, as described above, the variable periodic signal generation unit 442 of the period control circuit 440 includes the first variable periodic signal output unit 442A configured to output the first variable periodic signal OSC2 having the second period twice the period of the first period, the second variable periodic signal output unit 442B configured to output the second variable periodic signal OSC4 having the second period four times the first period, and the third variable periodic signal output unit 442C configured to output the third variable periodic signal OSC8 having the second period eight times the first period. The first through third variable periodic signal output units 442A, 442B and 442C are similarly constructed.

That is, the first variable periodic signal output unit 442A receives the periodic signal OSC through an input terminal to output the first variable periodic signal OSC2 through an output terminal. The second variable periodic signal output unit 442B receives the first variable periodic signal OSC2 through an input terminal to output the second variable periodic signal OSC4 through an output terminal. The third variable periodic signal output unit 442C receives the second variable periodic signal OSC4 through an input terminal to output the third variable periodic signal OSC8 through an output terminal.

Therefore, assuming that input/output signals are not specified but general input/output signals IN and OUT are applied to an input terminal and an output terminal, respectively in each of the first through third variable periodic signal output units 442A, 442B and 442C, each of the first through third variable periodic signal output units 442A, 442B and 442C may have the same design configuration as following.

Each of the first through third variable periodic signal output units 442A, 442B and 442C includes first through fifth inverters INT1, INT2, INT3, INT4 and INT5, a NAND gate NAND, and first through fourth pass gates T1, T2, T3 and T4. The first inverter INT1 inverts an input signal IN applied to an input terminal and the second inverter INT2 inverts an output signal OUT applied to an output terminal. The first pass gate T1 controls an output signal of the second inverter INT2 to be applied to an A node in response to the input signal IN and an inverted input signal /IN. The NAND gate NAND performs a NAND operation on the oscillation control signal RSTB and the signal applied to the A node to apply an output signal to a B node. The third inverter INT3 inverts the signal applied to the B node. The second pass gate T2 controls an output signal of the third inverter INT3 to be applied to the A node in response to the input signal IN and the inverted input signal /IN. The third pass gate T3 controls the output signal of the NAND gate NAND to be applied to the C node in response to the input signal IN and the inverted input signal /IN. The fourth inverter INT4 inverts the signal applied to the C node, and the fifth inverter INT5 inverts the output signal OUT applied to the output terminal. The fourth pass gate T4 applies the output signal of the fifth inverter INT5 to the C node in response to the input signal IN and the inverted input signal /IN.

A common operation of the first through third variable periodic signals 442A, 442B and 442C included in the variable periodic signal generation unit 442 will be described below.

In a state that the oscillation control signal RSTB of logic low level is inputted to initialize the first through third variable periodic signals 442A, 442B and 442C, the output signal of the NAND gate NAND of logic high level is applied to the B node because the oscillation control signal RSTB is at logic low level. When the input signal IN is at logic low level as it does not oscillate yet, the third pass gate T3 is closed and thus the signal is applied to the B node so that the output signal OUT goes to logic low level. As aforementioned, the input signal IN may correspond to the periodic signal OSC, the first variable periodic signal OSC2 and the second variable periodic signal OSC4 in the first through third variable periodic signals 442A, 442B and 442C, respectively. The output signal OUT may correspond to the first variable periodic signal OSC2, the second variable periodic signal OSC4 and the third variable periodic signal OSC8 in the first through third variable periodic signals 442A, 442B and 442C, respectively. In this case, the first and fourth pass gates T1 and T4 are opened but the second pass gate T2 is closed so that the NAND gate NAND and the third inverter INT3 between the A node and the B node act as a latch for preventing the signal applied to the B node from floating.

When the oscillation control signal RSTB goes to logic high level and the input signal IN thus starts to oscillate, that is, when the input signal IN changes its logic level from Low to High, the second and third pass gates T2 and T3 are opened but the first and fourth pass gates T1 and T4 are closed so that the inversion signal of the output signal OUT is applied to the A node. Therefore, the A node goes to logic high level, the B node goes to logic low level as the output signal of the NAND gate is applied thereto, and a logic level of the output signal OUT does not change. The fourth and fifth inverters INT4 and INT5 between the C node and the output terminal act as a latch for preventing the output signal OUT from floating.

When the oscillation control signal RSTB maintains its logic high level, and the input signal IN continuously oscillates to be transited from logic low level to logic high level, the first and fourth pass gates T1 and T4 are opened but the second and third pass gates T2 and T3 are closed so that the signal applied to the B node is applied to the output terminal via the C node. Therefore, the output signal OUT applied to the output terminal is then transited to logic high level.

When the input signal IN repetitively oscillates under the state that the oscillation control signal RSTB maintains logic high level, the output signal OUT is transited at a falling edge of the input signal IN by the above-described mechanism, and thus the output signal OUT oscillates with a period twice the period of the input signal IN.

That is, the first variable periodic signal output unit 442A outputs the first variable periodic signal OSC2 through an output terminal, wherein the first variable periodic signal OSC2 has a period twice the period of the periodic signal OSC inputted through an input terminal. The second variable periodic signal output unit 442B outputs the second variable periodic signal OSC4 through an output terminal, wherein the second variable periodic signal OSC4 has a period twice the period of the first variable periodic signal OSC2 inputted through an input terminal. Likewise, the third variable periodic signal output unit 442C outputs the third variable periodic signal OSC8 through an output terminal, wherein the third variable periodic signal OSC8 has a period twice the period of the second variable periodic signal OSC4 inputted through an input terminal.

Figure 9:
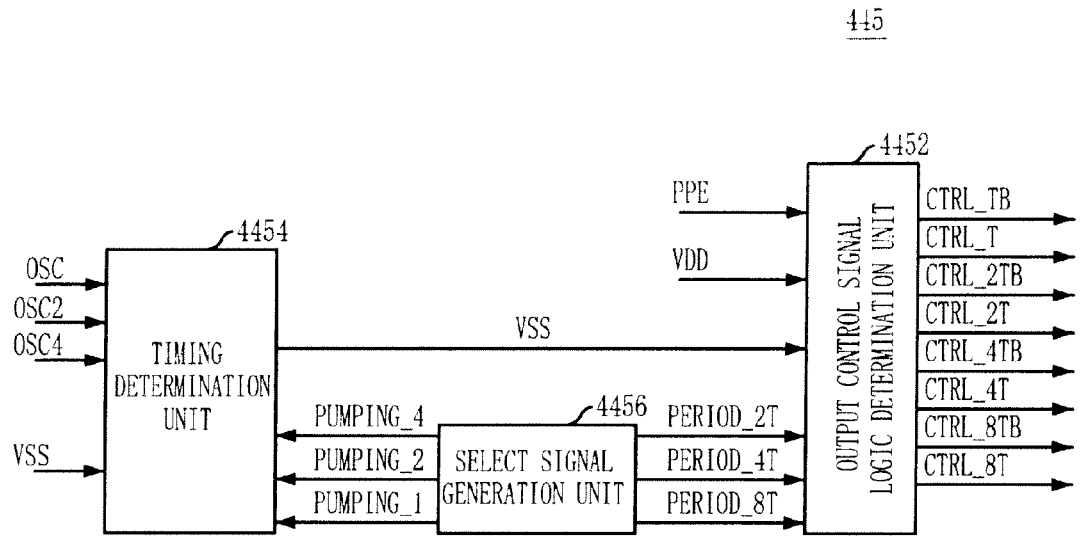
FIG. 9 is a block diagram illustrating an output control signal generation unit of FIG. 6.

FIG. 9 is a block diagram illustrating the output control signal generation unit 445 of FIG. 6.

Referring to FIG. 9, the output control signal generation unit 445 of the period control circuit 440 includes a select signal generation unit 4456, an output control signal logic determination unit 4452 and a timing determination unit 4454. The select signal generation unit 4456 generates first through third timing select signals PUMPING_1, PUMPING_2 and PUMPING_4, and first through third period select signals PERIOD_2T, PERIOD_4T and PERIOD_8T in response to the option. The output control signal logic determination unit 4452 changes logic levels of the output control signals CTRL_TB, CTRL_T, CTRL_2TB, CTRL_2T, CTRL_4TB, CTRL_4T, CTRL_8TB and CTRL_8T in response to the detection signal PPE and the first through third period select signals PERIOD_2T, PERIOD_4T and PERIOD_8T. The timing determination unit 4454 determines the entry point of the latter section in response to the first through third timing select signals PUMPING_1, PUMPING_2 and PUMPING_4, the periodic signal OSC and the plurality of variable periodic signals OSC2 and OSC4.

An operation of the output control signal generation unit 4452 of the period control circuit 440 will be described below.

The select signal generation unit 4456 activates one of the timing select signals PUMPING_1, PUMPING_2 and PUMPING_4 in response to the option, and simultaneously activates one of the first through third period select signals PERIOD_2T, PERIOD_4T and PERIOD_8T in response to the option.

The timing determination unit 4454 determines the entry point of the latter section in response to one of the activated first through third timing select signals PUMPING_1, PUMPING_2 and PUMPING_4 inputted from the select signal generation unit 4456, the periodic signal OSC and the plurality of variable periodic signals OSC2 and OSC4, and supplies a ground voltage VSS to the output control signal logic determination unit 4452 at the determined entry point of the latter section.

The output control signal logic determination unit 4452 is responsive to one of the activated first through third period select signals PERIOD_2T, PERIOD_4T and PERIOD_8T inputted from the select signal generation unit 4456 to thereby select one pair of output control signals among the first pair of output control signals CTRL_T and CTRL_TB, the second pair of output control signals CTRL_2T and CTRL_2TB, the third pair of output control signals CTRL_4T and CTRL_4TB and the fourth pair of output control signals CTRL_8T and CTRL_8TB. The output control signal logic determination unit 4452 then activates the selected pair of output control signals at the moment that the ground voltage VSS is inputted from the timing determination unit 4454 at the entry point of the latter section.

Figure 10:
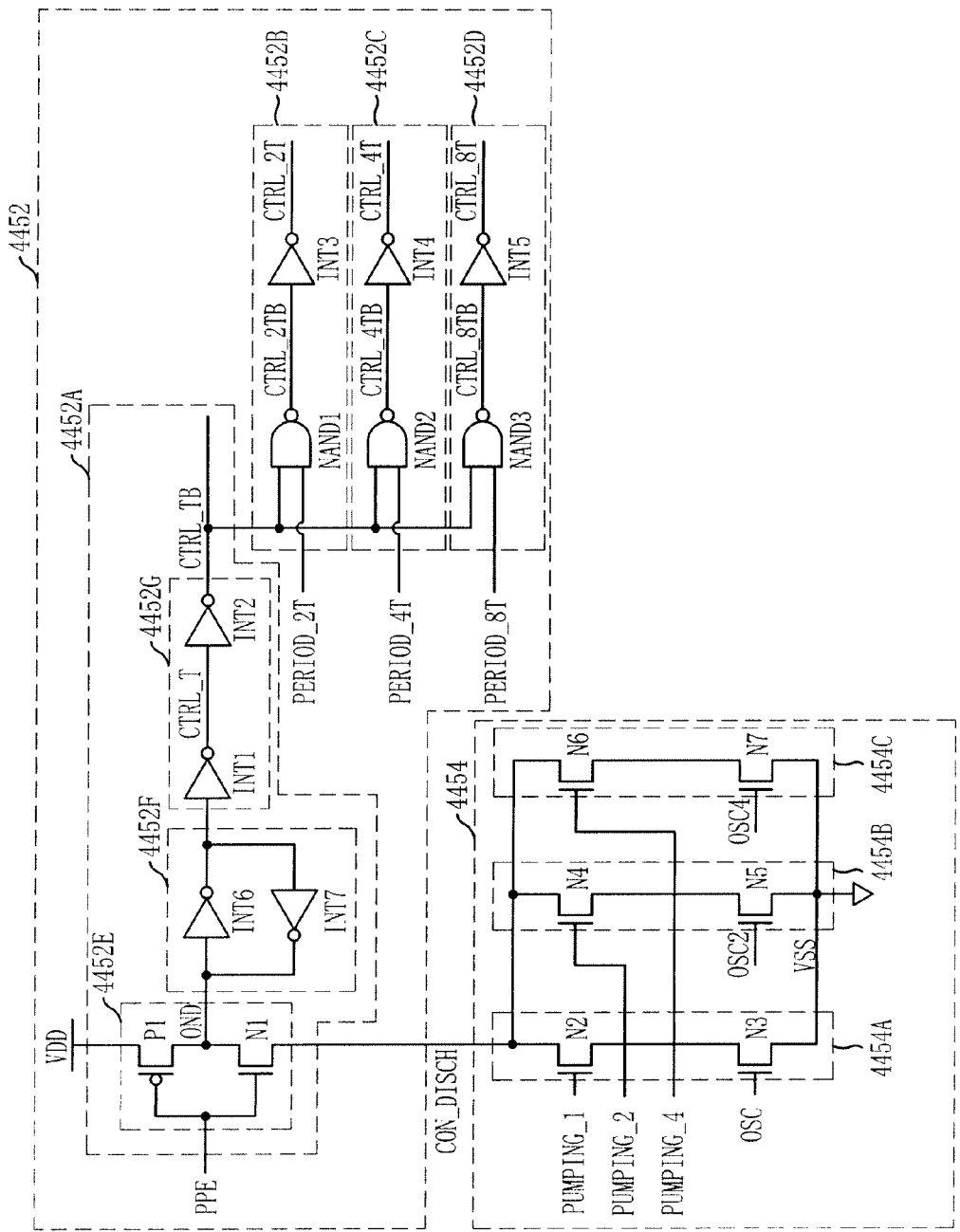
FIG. 10 is a circuit diagram illustrating an output control signal logic determination unit and a timing determination unit of FIG. 9.

FIG. 10 is a circuit diagram illustrating the output control signal logic determination unit 4452 and the timing determination unit 4454 of FIG. 9.

Referring to FIG. 10, the output control signal logic determination unit 4452 of the output control signal generation unit 445 includes first through fourth output units 4452A, 4452B, 4452C and 4452D. The first output unit 4452A outputs the first output control signal CTRL_T and the inverted first output control signal CTRL_TB in response to the detection signal PPE. The second output unit 4452B outputs the second output control signal CTRL_2T and the inverted second output control signal CTRL_2TB in response to the inverted first output control signal CTRL_TB and the first period select signal PERIOD_2T. The third output unit 4452C outputs the third output control signal CTRL_4T and the inverted third output control signal CTRL_4TB in response to the inverted first output control signal CTRL_TB and the second period select signal PERIOD_4T. The fourth output unit 4452D outputs the fourth output control signal CTRL_8T and the inverted fourth output control signal CTRL_8TB in response to the inverted first output control signal CTRL_TB and the third period select signal PERIOD_8T.

The first output unit 4452A includes a driving unit 4452E, a latch unit 4452F and a signal output unit 4452G. The driving unit 4452E drives an output node OND in response to the detection signal PPE, wherein the driving unit 4452E is pulled up using the power supply voltage VDD and pulled down using a voltage applied to a pull-down node CON_DISCH. The latch unit 4452F prevents the signal applied to the output node OND from floating. The signal output unit 4452G outputs an output signal of the latch unit 4452F as the first output control signal CTRL_T and the inverted first output control signal CTRL_TB.

The driving unit 4452E of the first output unit 4452A includes a PMOS transistor P1 and a first NMOS transistor N1 which are connected in series between a power supply voltage terminal and the pull-down node CON_DISCH. Herein, the PMOS transistor P1 controls the source-drain connected power supply voltage (VDD) terminal and the output node OND to be connected in response to the detection signal inputted through a gate thereof. The first NMOS transistor N1 controls the drain-source connected output node OND and the pull-down node CON_DISCH to be connected in response to the detection signal PPE inputted through a gate thereof.

The signal output unit 4452G of the first output unit 4452A includes a first inverter INT1 configured to invert an output signal of the latch unit 4452F to output the first output control signal CTRL_T and a second inverter INT2 configured to invert the first output control signal to output the inverted first output control signal CTRL_TB.

The second output unit 4452B includes a NAND gate NAND1 configured to perform a NAND operation on the inverted first output control signal CTRL_TB and the first period select signal PERIOD_2T to output the inverted second output control signal CTRL_2TB, and an inverter INT3 configured to receive the inverted second output control signal CTRL_2TB to output the second output control signal CTRL_2T.

The third output unit 4452C includes a NAND gate NAND2 configured to perform a NAND operation on the inverted first output control signal CTRL_TB and the second period select signal PERIOD_4T to output the inverted third output control signal CTRL_4TB, and an inverter INT4 configured to receive the inverted third output control signal CTRL_4TB to output the third output control signal CTRL_4T.

The fourth output unit 4452D includes a NAND gate NAND3 configured to perform a NAND operation on the inverted first output control signal CTRL_TB and the third period select signal PERIOD_8T to output the inverted fourth output control signal CTRL_8TB, and an inverter INT5 configured to receive the inverted fourth output control signal CTRL_8TB to output the fourth output control signal CTRL_8T.

The timing determination unit 4454 of the output control signal generation unit 445 includes first through third pull-down controllers 4454A, 4454B and 4454C. The first pull-down controller 4454A controls the pull-down node CON_DISCH and the ground voltage (VSS) terminal to be connected in response to the first timing select signal PUMPING_1 and the periodic signal OSC. The second pull-down controller 4454B controls the pull-down node CON_DISCH and the ground voltage (VSS) terminal to be connected in response to the second timing select signal PUMPING_2 and the first variable periodic signal OSC2. The third pull-down controller 4454C controls the pull-down node CON_DISCH and the ground voltage (VSS) terminal to be connected in response to the third timing select signal PUMPING_4 and the second variable periodic signal OSC4.

The first pull-down controller 4454A includes a first NMOS transistor N2 and a second NMOS transistor N3 which are connected in series between the pull-down node CON_DISCH and the ground voltage (VSS) terminal. The first NMOS transistor N2 controls the drain-source connected pull-down node CON_DISCH and a connection node between the first and second NMOS transistors N2 and N3 to be connected in response to the first timing select signal PUMPING_1 inputted through a gate thereof. The second NMOS transistor N3 controls the drain-source connected connection node between the first and second NMOS transistors N2 and N3 and the ground voltage (VSS) terminal to be connected in response to the periodic signal OSC inputted through a gate thereof.

The second pull-down controller 4454B includes a first NMOS transistor N4 and a second NMOS transistor N5 which are connected in series between the pull-down node CON_DISCH and the ground voltage (VSS) terminal. The first NMOS transistor N4 controls the drain-source connected pull-down node CON_DISCH and a connection node between the first and second NMOS transistors N4 and N5 to be connected in response to the second timing select signal PUMPING_2 inputted through a gate thereof. The second NMOS transistor N5 controls the drain-source connected connection node between the first and second NMOS transistors N4 and N5 and the ground voltage (VSS) terminal to be connected in response to the first variable periodic signal OSC2 inputted through a gate thereof.

The third pull-down controller 4454C includes a first NMOS transistor N6 and a second NMOS transistor N7 which are connected in series between the pull-down node CON_DISCH and the ground voltage (VSS) terminal. The first NMOS transistor N6 controls the drain-source connected pull-down node CON_DISCH and a connection node between the first and second NMOS transistors N6 and N7 to be connected in response to the third timing select signal PUMPING_4 inputted through a gate thereof. The second NMOS transistor N7 controls the drain-source connected connection node between the first and second NMOS transistors N7 and N8 and the ground voltage (VSS) terminal to be connected in response to the second variable periodic signal OSC4 inputted through a gate thereof.

Operations of the output control signal logic determination unit 4452 and the timing determination unit 4454 will be described below.

To begin with, as for the operation of the timing determination unit 4454, which one operates among the first through this pull-down controllers 4454A, 4454B and 4454C is determined in response to one of the activated first through third timing control signals PUMPING_1, PUMPING_2 and PUMPING_4 generated from the select signal generation unit 4456.

That is, if the activated first timing control signal PUMPING_1 is inputted, the first pull-down controller 4454A operates to connect the pull-down node CON_DISCH and the ground voltage (VSS) terminal when the periodic signal OSC oscillating with the predetermined first period is transited from logic low level to logic high level once.

Likewise, if the activated second timing control signal PUMPING_2 is inputted, the second pull-down controller 4454B operates to connect the pull-down node CON_DISCH and the ground voltage (VSS) terminal when the first variable periodic signal OSC2 oscillating with the second period twice the predetermined first period is transited from logic low level to logic high level once.

Also, if the activated third timing control signal PUMPING_4 is inputted, the third pull-down controller 4454C operates to connect the pull-down node CON_DISCH and the ground voltage (VSS) terminal when the second variable periodic signal OSC4 oscillating with the second period four times the predetermined first period is transited from logic low level to logic high level once.

As for the operation of the output control signal logic determination unit 4452, at the initial state when the detection signal PPE does not oscillate as being deactivated at the logic low level, the first output unit 4452A activates the first output control signal CTRL_T to logic high level and the inverted first output control signal to logic low level, respectively.

Since the inverted first output control signal CTRL_TB is at logic low level at this time, the second through fourth output units 4452B, 4452C and 4452D deactivate the second through fourth output control signals CTRL_2T, CTRL_4T and CTRL_8T to logic low level and also deactivate the inverted second through third output control signals CTRL_2TB, CTRL_4TB and CTRL_8TB to logic high level, regardless of logic levels of the period select signals PERIOD_2T, PERIOD_4T and PERIOD_8T.

When the detection signal PPE is activated to logic high level and the timing determination unit 4454 does not supply the ground voltage VSS to the pull-down node CON_DISCH yet, that is, when the operation enters the initial section, the first output unit 4452A activates the first output control signal CTRL_T to logic high level and the inverted first output control signal CTRL_TB to logic low level, respectively, like the initial state.

Similarly, since the inverted first output control signal CTRL_TB is at logic low level at this time, the second through fourth output units 4452B, 4452C and 4452D deactivate the second through fourth output control signals CTRL_2T, CTRL_4T and CTRL_8T to logic low level and also deactivate the inverted second through third output control signals CTRL_2TB, CTRL_4TB and CTRL_8TB to logic high level, regardless of logic levels of the period select signals PERIOD_2T, PERIOD_4T and PERIOD_8T.

Afterwards, when the detection signal PPE maintains its activation state of logic high level and the timing determination unit 4454 supplies the ground voltage VSS to the pull-down node CON_DISCH, that is, when the operation enters the latter section, the first output unit 4452A deactivates the first output control signal CTRL_T to logic low level and the inverted first output control signal CTRL_TB to logic high level, respectively.

Since the inverted first output control signal CTRL_TB is at logic high level at this time, one of the second through fourth output units 4452B, 4452C and 4452D operates in response to one of the first through third period select signals PERIOD_2T, PERIOD_4T and PERIOD_8T, and activates one pair of the output control signals corresponding to the operating output unit among the second pair of output signals CTRL_2T and CTRL_2TB, the third pair of output signals CTRL_4T and CTRL_4TB and the fourth pair of output signals CTRL_8T and CTRL_8TB.

Figure 11:
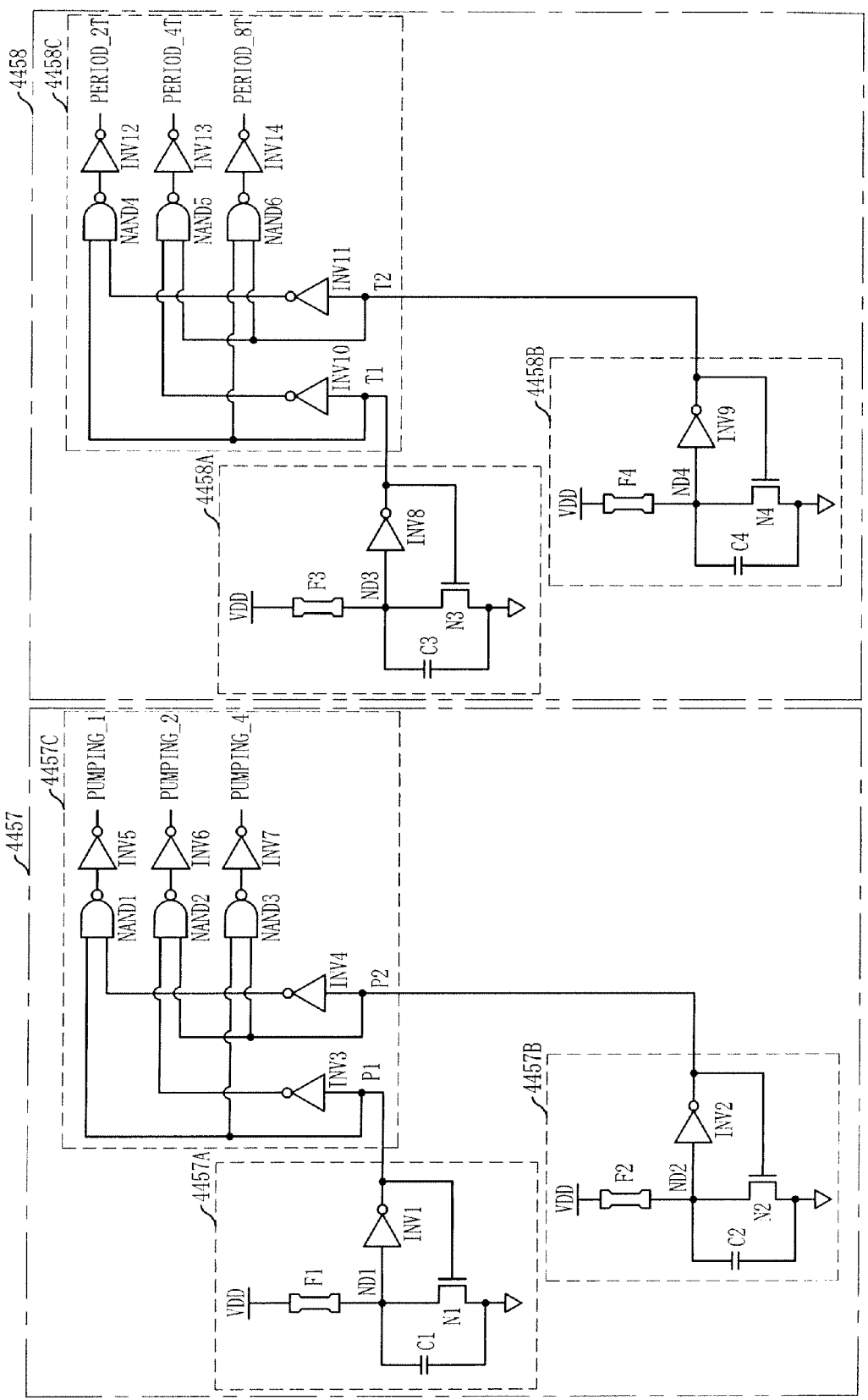
FIG. 11 is a circuit diagram illustrating a select signal generation unit of FIG. 9.

FIG. 11 is a circuit diagram illustrating the select signal generation unit 4456 of FIG. 9.

Referring to FIG. 11, the select signal generation unit 4456 of the output control signal generation unit 445 includes a timing select signal output unit 4457 configured to output the timing select signals PUMPING_1. PUMPING_2 and PUMPING_3 in response to the option, and the period select signal output unit 4458 configured to output the period select signals PERIOD_2T, PERIOD_4T and PERIOD_8T in response to the option.

Herein, the timing select signal output unit 4457 and the period select signal output unit 4458 have the similar design configuration. The timing select signal output unit 4457 includes a first signal output unit 4457A configured to output a first signal P1 activated in a first select mode or a second select mode of the option, a second signal output unit 4457B configured to a second signal P2 activated in the second select mode or a third select mode of the option, and a logic level determination unit 4457C configured to determine logic levels of the timing select signals PUMPING_1, PUMPING_2 and PUMPING_3 in response to the first and second signals P1 and P2.

The first signal output unit 4457A of the timing select signal output unit 4457 includes a fuse F1, an NMOS transistor N1, a capacitor C1 and an inverter INV1. The fuse F1 controls a power supply (VDD) voltage terminal and an intermediate node ND1 to be connected in response to the option. The NMOS transistor N1 controls the drain-source connected intermediate node ND1 and the ground voltage (VSS) terminal to be connected in response to the first signal P1 inputted through a gate thereof. The capacitor C1 having a predetermined capacitance is connected in parallel between the intermediate node ND1 and the ground voltage (VSS) terminal. The inverter INV1 receives the voltage applied to the intermediate node ND1 to output the first signal P1.

The second signal output unit 4457B of the timing select signal output unit 4457 includes a fuse F2, an NMOS transistor N2, a capacitor C2 and an inverter INV2. The fuse F2 controls the power supply voltage (VDD) terminal and an intermediate node ND2 to be connected in response to the option. The NMOS transistor N2 controls the drain-source connected intermediate node ND2 and the ground voltage (VSS) terminal to be connected in response to the second signal P2 inputted through a gate thereof. The capacitor C2 is connected in parallel between the intermediate node ND2 and the ground voltage (VSS) terminal. The inverter INV2 receives the voltage applied to the intermediate node ND2 to output the second signal P2.

The logic level determination unit 4457C of the timing select signal output unit 4457 includes first through fifth inverters INV3, INV4, INV4, INV5, INV6 and INV7, and first through third NAND gates NAND1, NAND2 and NAND3. The first inverter INV3 inverts the first signal P1, and the second inverter INV4 inverts the second signal P2. The first NAND gate NAND1 performs a NAND operation on the first signal P1 and an output signal of the second inverter INV4. The third inverter INV5 receives the output signal of the first NAND gate NAND1 to output the first timing select signal PUMPING_1. The second NAND gate performs a NAND operation on an output signal of the first inverter INV3 and the second signal P2. The fourth inverter INV6 receives an output signal of the second NAND gate NAND2 to output the second timing select signal PUMPING_2. The third NAND gate NAND3 performs a NAND operation on the first signal P1 and the second signal P2. The fifth inverter INV7 receives an output signal of the third NAND gate NAND3 to output the third timing select signal PUMPING_4.

The period select signal output unit 4457 includes a first signal output unit 4458A configured to output a first signal T1 activated in the first select mode or the second select mode of the option, a second signal output unit 4458B configured to a second signal T2 activated in the second select mode or a third select mode of the option, and a logic level determination unit 4458C configured to determine logic levels of the period select signals PERIOD_2T, PERIOD_4T and PERIOD_8T in response to the first and second signals T1 and T2.

The first signal output unit 4458A of the period select signal output unit 4458 includes a fuse F3, an NMOS transistor N3, a capacitor C3 and an inverter INV8. The fuse F3 controls the power supply voltage (VDD) terminal and an intermediate node ND3 to be connected in response to the option. The NMOS transistor N3 controls the drain-source connected intermediate node ND1 and the ground voltage (VSS) terminal to be connected in response to the first signal T1 inputted through a gate thereof. The capacitor C3 is connected in parallel between the intermediate node ND3 and the ground voltage (VSS) terminal. The inverter INV8 receives the voltage applied to the intermediate node ND3 to output the first signal T1.

The second signal output unit 4458B of the period select signal output unit 4458 includes a fuse F4, an NMOS transistor N4, a capacitor C4 and an inverter INV9. The fuse F4 controls the power supply voltage (VDD) terminal and an intermediate node ND4 to be connected in response to the option. The NMOS transistor N4 controls the drain-source connected intermediate node ND4 and the ground voltage (VSS) terminal to be connected in response to the second signal T2 inputted through a gate thereof. The capacitor C4 is connected in parallel between the intermediate node ND4 and the ground voltage (VSS) terminal. The inverter INV9 receives the voltage applied to the intermediate node ND4 to output the second signal T2.

The logic level determination unit 4458C of the period select signal output unit 4458 includes first through fifth inverters INV10, INV11, INV12, INV13, INV14 and INV15, and first through third NAND gates NAND4, NAND5 and NAND6. The first inverter INV10 inverts the first signal T1, and the second inverter INV11 inverts the second signal T2. The first NAND gate NAND4 performs a NAND operation on the first signal T1 and an output signal of the second inverter INV11. The third inverter INV12 receives the output signal of the first NAND gate NAND4 to output the first period select signal PERIOD_2T. The second NAND gate NAND5 performs a NAND operation on an output signal of the first inverter INV10 and the second signal T2. The fourth inverter INV13 receives an output signal of the second NAND gate NAND5 to output the second period select signal PERIOD_4T. The third NAND gate NAND6 performs a NAND operation on the first signal T1 and the second signal T2. The fifth inverter INV14 receives an output signal of the third NAND gate NAND6 to output the third period select signal PERIOD_8T.

An operation of the select signal generation unit 4456 of the output control signal generation unit 445 will be described below.

The operation of the timing select signal output unit 4457 of the select signal generation unit 4456 will be summarized in Table 1 below.

TABLE 1

| Fuse (F1) of first signal output unit (4457A) | NO CUT | NO CUT | CUT | CUT |
|---|---|---|---|---|
| Fuse (F2) of second signal output unit (4457B) | CUT | NO CUT | NO CUT | CUT |

TABLE 1-continued

| Select mode of option | First select mode | Second select mode | Third select mode | X (No select mode) |
|---|---|---|---|---|
| Logic level of first signal (P1) | H | H | L | L |
| Logic level of second signal (P2) | L | H | H | L |
| Operation of logic level determination unit (4457C) | Activation of first timing select signal (PUMPING_1) | Activation of third timing select signal (PUMPING_4) | Activation of second timing select signal (PUMPING_2) | Deactivation of timing select signal |

From Table 1, it can be appreciated that the logic level determination unit 4457C selectively activates one of the first through third timing select signals PUMPING_1, PUMPING_2 and PUMPING_3 depending on states of the fuse F1 of the first signal output unit 4457A and the fuse F2 of the second signal output unit 4457B.

The operation of the period select signal output unit 4458 of the select signal generation unit 4456 will be summarized in Table 2 below.

TABLE 2

| Fuse (F3) of first signal output unit (4458A) | NO CUT | NO CUT | CUT | CUT |
|---|---|---|---|---|
| Fuse (F4) of second signal output unit (4458B) | CUT | NO CUT | NO CUT | CUT |
| Select mode of option | First select mode | Second select mode | Third select mode | X (No select mode) |
| Logic level of first signal (T1) | H | H | L | L |
| Logic level of second signal (T2) | L | H | H | L |
| Operation of logic level determination unit (4458C) | Activation of first period select signal (PERIOD_2T) | Activation of third period select signal (PERIOD_8T) | Activation of second period select signal (PERIOD_4T) | Deactivation of period select signal |

From Table 2, it can be appreciated that the logic level determination unit 4458C selectively activates one of the first through third period select signals PERIOD_2T, PERIOD_4T and PERIOD_8T depending on states of the fuse F3 of the first signal output unit 4458A and the fuse F4 of the second signal output unit 4458B.

The option used in the select signal generation unit 4456 is a value which can be arbitrarily selected by a designer. As the option, other various methods, for example, a memory register set (MRS), which can select operation mode by a designer, may be used in addition to the method of using the fuse.

Figure 12:
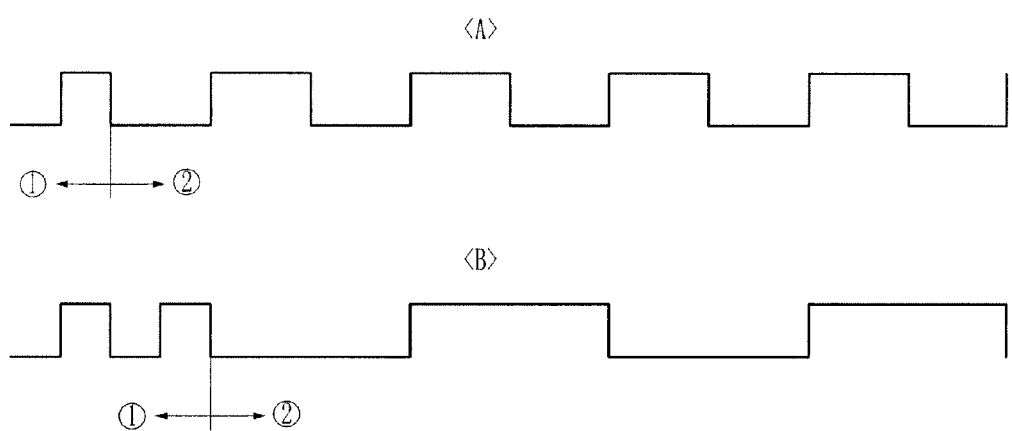
FIG. 12 is a timing diagram illustrating a waveform of an oscillation signal generated by an oscillation signal generation block of FIG. 4.

FIG. 12 is a timing diagram illustrating a waveform of an oscillation signal generated by the oscillation signal generation block 420 of FIG. 4.

Referring to FIG. 12, it can be appreciated that the waveform of the oscillation signal OSCD oscillating by the oscillation signal generation block 420 of the internal voltage generator of FIG. 4 changes depending on the initial section (①)) and the latter section (②).

Specifically, from the timing diagram <A> of FIG. 12, it can be observed that the oscillation signal OSCD oscillates with the predetermined first period by one period during the initial section (①) and instantly the operation then enters the latter section (②) so that the oscillation signal OSCD oscillates with the second period twice the predetermined first period.

From the timing diagram <B> of FIG. 12, it can be observed that the oscillation signal OSCD oscillates with the predetermined first period by two periods during the initial section (①) and instantly the operation then enters the latter section (②) so that the oscillation signal OSCD oscillates with the second period four times the predetermined first period.

In the case where the oscillation period of the oscillation signal OSCD is divided into the initial section (①) and the latter section (②), and the oscillation signal OSCD oscillates with different periods during each section, a voltage level of the generated boosted voltage is varied as followings.

Figure 13:
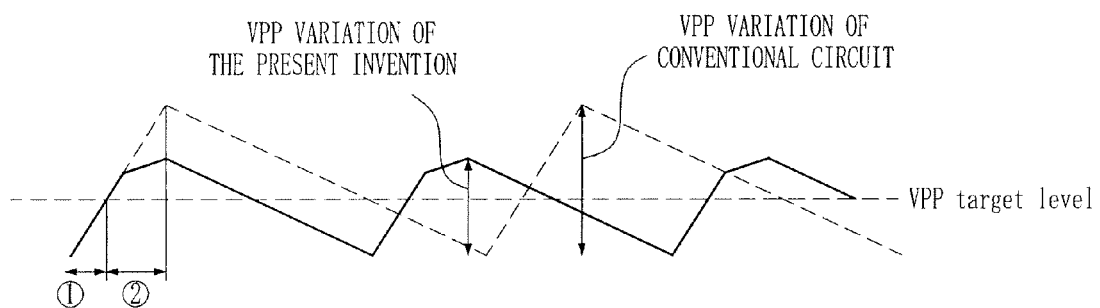
FIG. 13 is a timing diagram illustrating a level of a boosted voltage generated by the internal voltage generator of FIG. 4.

FIG. 13 is a timing diagram illustrating a level of a boosted voltage generated by the internal voltage generator of FIG. 4.

Referring to FIG. 13, it can be appreciated that a voltage level of the boosted voltage VPP (dotted line) generated by the conventional internal voltage generated differs from a voltage level of the boosted voltage VPP (solid line) generated by the inventive internal voltage generator.

Specifically, when the voltage level detection block 400 detects that the voltage level of the internal voltage VPP is lower than a target level at the initial state, the detection signal PPE is activated to logic high level so that the operation enters the initial section. Therefore, the oscillation signal generation block 420 generates the oscillation signal OSCD, which oscillates with the predetermined first period. Resultingly, the voltage level of the internal voltage VPP is rapidly increased through the charge pumping operation of the pump block 460 (①).

Thereafter, the detection signal PPE maintains its logic high level because the voltage level of the internal voltage VPP becomes higher than the target level but the voltage level detection block 400 does not detect that the voltage level of the internal voltage VPP is higher than the target level due to a relatively slow operating speed of the voltage level detection block 400.

However, the oscillation signal generation block 420 automatically terminates the initial section through a predetermined option and enters the latter section, and hence the oscillation signal generation block 420 automatically outputs the oscillation signal OSCD changing its oscillation period from the predetermined first period to the second period longer than the predetermined first period. This leads the charge pumping operation performed by the pump block 460 to get relatively slow. Therefore, the increase in the voltage level of the internal voltage VPP becomes relatively small (②).

Accordingly, during the sections (①+②) when the detection signal PPE maintains its logic high level, it can be understood that the voltage level of the boosted voltage VPP (dotted line) generated by the conventional internal voltage generator is higher than the voltage level of the boosted voltage VPP (solid line) generated by the internal voltage generator of the present invention.

As described above, in accordance with the embodiments of the present invention, it is possible to prevent the pump block 460 from excessively performing a charge pumping operation by controlling the period of the oscillation signal OSCD outputted from the oscillation signal generation block 420 to be automatically changed although the detection signal PPE keeps on maintaining its logic high level due to a relatively slow operating speed of the voltage level detection block 400.

This makes it possible to prevent a level variation of the internal voltage VPP, which is generated at the internal voltage generator of the semiconductor device, from being excessively increased. Furthermore, the magnitude of current used in driving the internal voltage generator of the semiconductor device can be maintained to be relatively small by maintaining the level variation of the internal voltage to be small using only small amount of current, which were possible through high current consumption in the conventional internal voltage generator.

Therefore, it is possible to realize the internal voltage generator of the semiconductor device, which can stably operate, by preventing a decrease in an efficiency of the internal voltage generator.

In accordance with the present invention as described above, it is possible to prevent a voltage level of an internal voltage from being excessively increased by controlling a speed of a charge pumping operation for increasing the voltage level of the internal voltage within an activation section of a detection signal even though the activation section of the detection signal outputted from an internal voltage level detection circuit becomes too long because the internal voltage level detection circuit operate at a relatively slower speed than a variation speed of the internal voltage level in an internal voltage generation circuit of a semiconductor device.

Furthermore, the amount of current consumed in an internal voltage generator of a semiconductor device can be maintained to be relatively small by maintaining a voltage level variation of an internal voltage to be small without relatively high current consumption for speeding up an operating speed of an internal voltage level detection circuit.

Therefore, it is possible to prevent a decrease in an efficiency of an internal voltage generator of a semiconductor device, thus realizing an internal voltage generator of a semiconductor device that stably operates.

While the present invention has been described with respect to the specific embodiments, it will be apparent to those skilled in the art that various changes and modifications may be made without departing from the spirit and scope of the invention as defined in the following claims.

For example, although the aforesaid embodiments exemplary illustrate the oscillation signal generation circuit which is included in the internal voltage generator of the semiconductor device, for generating the oscillation signal that oscillates with the predetermined first period during the initial section and thereafter oscillates with the second period longer than the predetermined first period during the latter section, the present invention is not limited thereto. That is, the present invention is also applicable to an oscillation signal generation circuit that is included in an internal device besides the internal voltage generator of a semiconductor device (for example, all of internal devices such as an amplification device and a driving device included in the semiconductor device), and is configured to generate the oscillation signal that oscillates with the predetermined first period during the initial section and thereafter oscillates with the second period longer than the predetermined first period during the latter section.

Although the foregoing embodiments illustrate that the oscillation section is divided into two sections, i.e., the initial section and the latter section, and the oscillation signal generation circuit changes the oscillation frequency during each section, the present invention can be modified such that the oscillation section is divided into a first section, a second section, . . . , and an Nth section (N is a natural number) and the oscillation frequency changes in every section.

Further, in the embodiments as described above, it is illustrated that number of the option and corresponding selectable number of the period changing point or period changing range of the oscillation signal are limited to 3 or 4, the present invention is also applicable to the case where such a number is more than or less than the above-described number.

Although the previous embodiments and the drawings exemplarily illustrate that the boosted voltage (VPP) is used as the internal voltage, the present invention is also applicable to the case where all the voltages generated by charge pumping operation, for example, a boosted voltage (VPP) and a back bias voltage (VBB), are used as the internal voltage.

Further, the logic gates and the transistors exemplarily illustrated in the aforesaid embodiments should be differently implemented such that their locations and sorts differ depending on polarities of signals.

What is claimed is:

1. A semiconductor device, comprising:
    an oscillation unit configured to generate an oscillation signal in response to an input signal, wherein the oscillation signal oscillates with a first period in a first section and oscillates with a second period longer than the first period in a second section; and
    an internal circuit configured to perform a predetermined operation in response to the oscillation signal,
    wherein the oscillation unit includes:
    a period controller configured to generate an oscillation control signal in response to the input signal; and
    a periodic signal oscillator configured to generate a first periodic signal oscillating with the first period in response to the oscillation control signal to said period controller,
    wherein the oscillation signal is generated by controlling a period of the first periodic signal in response to the oscillation control signal based on the first periodic signal.

2. The semiconductor device as recited in claim 1, wherein a period of the oscillation signal is controlled to change from the first period to the second period depending on the input signal.

3. The semiconductor device as recited in claim 2, wherein the period controller includes:

a variable periodic signal generator configured to generate a plurality of variable periodic signals, each having a period longer than the first period in response to the oscillation control signal and the first periodic signal, wherein the plurality of variable periodic signals have different periods from each other;

a signal selector configured to output the first periodic signal as the oscillation signal in the first section, and to select and output one of the variable periodic signals depending on the input signal in the second section; and an oscillation control signal output unit configured to output the oscillation control signal of which a level is changed in response to the input signal.

4. The semiconductor device as recited in claim 3, wherein the variable periodic signal generator includes:

a first variable periodic signal output unit configured to receive the first periodic signal and the oscillation control signal and output a first variable periodic signal having a period twice the first period;

a second variable periodic signal output unit configured to receive the first variable periodic signal and the oscillation control signal and output a second variable periodic signal having a period four times the first period; and a third variable periodic signal output unit configured to receive the second variable periodic signal and the oscillation control signal and output a third variable periodic signal having a period eight times the first period.

5. The semiconductor device as recited in claim 3, wherein the signal selector includes:

a multiplexer configured to select one signal among the periodic signal and the variable periodic signals to output the selected one as the oscillation signal in response to output control signals; and an output control signal generator configured to generate the output control signals in response to the input signal, the first periodic signal and the variable periodic signals.

6. The semiconductor device as recited in claim 5, wherein the output control signal generator includes:

a select signal generator configured to generate timing select signals and period select signals;

an output control signal logic determination unit configured to change a logic level of the output control signals in response to the input signal, the period select signals and a timing determination signal; and a timing determination unit configured to generate the timing determination signal in response to the timing select signals, the periodic signal and the variable periodic signals.

7. The semiconductor device as recited in claim 6, wherein the select signal generator includes:

a timing select signal output unit configured to output the timing select signals and a period select signal output unit configured to output the period select signals.

8. The semiconductor device as recited in claim 7, wherein the oscillation control signal output unit outputs the oscillation control signal in response to the input signal and one of the output control signals.

9. The semiconductor device as recited in claim 8, wherein the oscillation control signal output unit activates the oscillation control signal in response the input signal in the first section, and deactivates the oscillation control signal in response to the one of the output control signals in the second section.

10. The semiconductor device as recited in claim 7, wherein each of the timing select signal output unit and the period select signal output unit includes:

a first signal output unit configured to output a first signal activated during a first select mode or a second select mode;

a second signal output unit configured to output a second signal activated during the second select mode or a third select mode; and a logic level determination unit configured to determine a logic level of the timing select signals or the period select signals in response to the first signal or the second signal.

11. An internal voltage generator of a semiconductor device, comprising:

a voltage level detector configured to detect a voltage level of an internal voltage to output a detection signal;

an oscillation signal generator configured to generate an oscillation signal in response to the detection signal, wherein the oscillation signal oscillates with a first period in a first section and oscillates with a second period longer than the first period in a second section; and a pump configured to perform a charge pumping operation to output the internal voltage in response to the oscillation signal, wherein the detection signal has a first logic level when the internal voltage is lower than a reference voltage and has a second logic level when the internal voltage is higher than the reference voltage, wherein the oscillation unit includes:

a period controller configured to generate an oscillation control signal in response to the input signal; and a periodic signal oscillator configured to generate a first periodic signal oscillating with the first period in response to the oscillation control signal to said period controller, wherein the oscillation signal is generated by controlling a period of the first periodic signal in response to the oscillation control signal based on the first periodic signal.

12. The internal voltage generator as recited in claim 11, wherein a period of the oscillation signal is controlled to change from the first period to the second period depending on the detection signal.

13. The internal voltage generator as recited in claim 12, wherein the period controller includes:

a variable periodic signal generator configured to generate a plurality of variable periodic signals, each having a period longer than the first period in response to the oscillation control signal and the first periodic signal, wherein the plurality of variable periodic signals have different periods from each other;

a signal selector configured to output the periodic signal as the oscillation signal in the first section, and to select and output one of the plurality of variable periodic signals depending on the detection signal in the second section; and an oscillation control signal output unit configured to output the oscillation control signal of which a level is changed in response to the detection signal.

14. The internal voltage generator as recited in claim 13, wherein the variable periodic signal generator includes:

a first variable periodic signal output unit configured to receive the first periodic signal and the oscillation control signal to output a first variable periodic signal having a period twice the first period;

a second variable periodic signal output unit configured to receive the first variable periodic signal and the oscillation control signal to output a second variable periodic signal having a period four times the first period; and a third variable periodic signal output unit configured to receive the second variable periodic signal and the oscillation control signal to output a third variable periodic signal having a period eight times the first period.

15. The internal voltage generator as recited in claim 13, wherein the oscillation control signal output unit outputs the oscillation control signal that is deactivated when the detection signal has the first logic level.

16. The internal voltage generator as recited in claim 13, wherein the oscillation control signal output unit activates the oscillation control signal when the detection signal has the second logic level, and deactivates the oscillation control signal.

17. The internal voltage generator as recited in claim 13, wherein the signal selector includes:

a multiplexer configured to select one signal among the periodic signal and the plurality of variable periodic signals to output the selected one as the oscillation signal in response to output control signals; and an output control signal generator configured to generate the output control signals in response to the detection signal, the first periodic signal and the plurality of variable periodic signals.

18. The internal voltage generator as recited in claim 17, wherein the output control signal generator includes:

a select signal generator configured to generate timing select signals and period select signals;

an output control signal logic determination unit configured to change a logic level of the output control signals in response to the detection signal and the period select signals; and a timing determination unit configured to determine the entry point of the latter section in response to the timing select signals, the periodic signal and the plurality of variable periodic signals.

19. The semiconductor device as recited in claim 18, wherein the select signal generator includes:

a timing select signal output unit configured to output the timing select signals; and a period select signal output unit configured to output the period select signals.

20. A method for generating an internal voltage of a semiconductor device, the method comprising:

detecting a voltage level of an internal voltage to output a detection signal;

generating an oscillation signal using an oscillation unit in response to the detection signal, wherein the oscillation signal oscillates with a first period in a first section and oscillates with a second period longer than the first period in a second section; and performing a charge pumping operation to output the internal voltage in response to the oscillation signal, wherein the generating of the oscillation signal includes:

generating an oscillation control signal in response to an input signal using a period controller;

generating a first periodic signal oscillating with the first period in response to the oscillation control signal to said period controller using a period signal generator; and generating the oscillation signal by controlling a period of the first periodic signal in response to the oscillation control signal based on the first periodic signal.

21. The method as recited in claim 20, wherein a period of the oscillation signal is controlled to change from the first period to the second period depending on the detection signal.

22. The method as recited in claim 21, wherein the generating the oscillation control signal and the generating of the oscillation signal includes:

generating a plurality of variable periodic signals having a period longer than the first period in response to the oscillation control signal and the periodic signal, wherein the plurality of variable periodic signals have different periods from each other;

outputting the periodic signal as the oscillation signal in the first section, and selecting one of the plurality of variable periodic signals to output the selected signal as the oscillation signal depending on the detection signal in the second section; and outputting the oscillation control signal of which a level is changed in response to the detection signal.

23. The method as recited in claim 22, wherein the generating of the plurality of variable periodic signals includes:

receiving the periodic signal and the oscillation control signal to output a first variable periodic signal having a period twice the first period;

receiving the first variable periodic signal and the oscillation control signal to output a second variable periodic signal having a period four times the first period; and receiving the second variable periodic signal and the oscillation control signal to output a third variable periodic signal having a period eight times the first period.

24. The method as recited in claim 22, wherein the outputting of signals as the oscillation signal includes:

selecting one signal among the periodic signal and the plurality of variable periodic signals to output the one signal as the oscillation signal in response to output control signals; and generating the output control signals in response to the detection signal, the periodic signal and the plurality of variable periodic signals.

25. The method as recited in claim 24, wherein the generating of the output control signals includes:

generating timing select signals and period select signals;

changing a logic level of the output control signals in response to the detection signal and the period select signals; and determining the entry point of the latter section in response to the timing select signals, the periodic signal and the plurality of variable periodic signals.

* * * * *